US010908517B2

(12) United States Patent
Van Damme et al.

(10) Patent No.: US 10,908,517 B2
(45) Date of Patent: Feb. 2, 2021

(54) SETPOINT GENERATOR, LITHOGRAPHIC APPARATUS, LITHOGRAPHIC APPARATUS OPERATING METHOD, AND DEVICE MANUFACTURING METHOD

(71) Applicant: ASML Netherlands B.V., Veldhoven (NL)

(72) Inventors: Jean-Philippe Xavier Van Damme, Wezembeek-Oppem (BE); Laurentius Johannes Adrianus Van Bokhoven, Veldhoven (NL); Petrus Franciscus Van Gils, Rijen (NL); Gerben Pieterse, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/615,810

(22) PCT Filed: Apr. 18, 2018

(86) PCT No.: PCT/EP2018/059830
§ 371 (c)(1),
(2) Date: Nov. 21, 2019

(87) PCT Pub. No.: WO2018/215140
PCT Pub. Date: Nov. 29, 2018

(65) Prior Publication Data
US 2020/0174381 A1 Jun. 4, 2020

(30) Foreign Application Priority Data
May 23, 2017 (EP) .................................. 17172452

(51) Int. Cl.
*G03B 27/58* (2006.01)
*G03F 7/20* (2006.01)

(52) U.S. Cl.
CPC .................. *G03F 7/70725* (2013.01)

(58) Field of Classification Search
CPC ............ G03F 7/70425; G03F 7/70725; G03F 7/70783; G03F 7/70983
See application file for complete search history.

(56) References Cited

U.S. PATENT DOCUMENTS

| 2004/0051057 A1 | 3/2004 | Yoshida |
| 2005/0140949 A1 | 6/2005 | Jasper et al. |

(Continued)

FOREIGN PATENT DOCUMENTS

| JP | 2006-024763 A | 1/2006 |
| WO | WO 2016/169727 A1 | 10/2016 |
| WO | WO 2017/050508 A1 | 3/2017 |

OTHER PUBLICATIONS

Research Disclosure No. 628018 Aug. 2016; 5 pages.
(Continued)

*Primary Examiner* — Peter B Kim
(74) *Attorney, Agent, or Firm* — Sterne, Kessler, Goldstein & Fox P.L.L.C.

(57) ABSTRACT

The invention relates to a setpoint generator for moving a patterning device of a lithographic apparatus, the patterning device being capable of imparting a radiation beam with a pattern in its cross-section to form a patterned radiation beam, wherein the setpoint generator comprises a finite number of movement profiles for the patterning device, and wherein the setpoint generator is configured to select one of the finite number of movement profiles based on a desired movement profile and to output the selected movement profile as a setpoint for the patterning device.

15 Claims, 5 Drawing Sheets

(56) References Cited

U.S. PATENT DOCUMENTS

| | | |
|---|---|---|
| 2006/0087632 A1 | 4/2006 | Tousain |
| 2007/0219647 A1 | 9/2007 | Heertjes et al. |
| 2007/0250187 A1 | 10/2007 | Heertjes |
| 2008/0246934 A1 | 10/2008 | Van Den Biggelaar |
| 2015/0331327 A1 | 11/2015 | Baba |
| 2015/0357944 A1 | 12/2015 | Makita et al. |

OTHER PUBLICATIONS

Cotte et al., "Dynamic studies of hard pellicle response during exposure scanning," Journal of Vacuum Science & Technology B: Microelectronics and Nanometer Structures Processing, Measurement, and Phenomena, vol. 20, No. 6. Nov. 2002; pp. 2995-2999.

Cotte et al., "Dynamic Studies of Hard Pellicle Response during Exposure Scanning," Computational Mechanics Center, University of Wisconsin—SRC Programs Review, 2002; pp. 1-12.

International Search Report and Written Opinion of the International Searching Authority directed to related International Patent Application No. PCT/EP2018/059830, dated Jul. 19, 2018; 10 pages.

International Search Report and Written Opinion of the International Searching Authority directed to related International Patent Application No. PCT/EP2018/059830, dated Nov. 26, 2019; 7 pages.

Japanese Notification of Reasons for Refusal directed to related Japanese Patent Application No. 2019-564818, dated Nov. 4, 2020; 7 pages.

SETPOINT GENERATOR, LITHOGRAPHIC APPARATUS, LITHOGRAPHIC APPARATUS OPERATING METHOD, AND DEVICE MANUFACTURING METHOD

CROSS-REFERENCE TO RELATED APPLICATIONS

This application claims priority of EP application 17172452.9 which was filed on 23 May 2017 and which is incorporated herein in its entirety by reference.

BACKGROUND

Field of the Invention

The present invention relates to a setpoint generator for moving a patterning device of a lithographic apparatus, a lithographic apparatus comprising such a setpoint generator, a method for operating such a lithographic apparatus and a device manufacturing method.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, the patterning device may be protected by a layer that is transparent to the radiation used for imaging the pattern onto the target portion. The layer may be implemented as a membrane kept at a short distance from the patterning device. Such membrane is also referred to as "pellicle". The transparent layer allows the radiation beam to be transmitted there through while providing some protection of the patterning device against damage, contamination, etc. In an embodiment, a pellicle is a thin, transparent film that is attached by a frame to the patterning device at a side of the patterning device facing the projection system. The pellicle and its frame keep the space between the pellicle and the patterning device free from dust and other foreign particles. In this way, any particles near the patterning device are kept away from the object plane and thus will be imaged out of focus in order to reduce or prevent imaging defects. The transparent layer may be provided at, and extend along a side of, the patterning device facing the projection system.

Some of the components in the lithographic apparatus may perform movements during operation of the lithographic apparatus. For example, the substrate table that holds the substrate, and the support that supports the patterning device, may perform a scanning movement. Thereby the support may be moved to follow movements of the substrate table so as to project respective parts of the pattern from the patterning device onto the substrate. Due to the movements of the support, the transparent layer may be subjected to forces that may cause the transparent layer to deform, such as acceleration/deceleration forces, air flows passing the transparent layer, etc. As a result of the deformation of the transparent layer, a projection of the pattern from the patterning device onto the substrate may be affected, causing an inaccuracy which may result into an overlay error.

Published patent publication WO2016/169727A1, which is hereby incorporated in its entirety by reference, discloses a lithographic apparatus comprising a transparent layer deformation-determining device to determine a deformation profile of the transparent layer, the deformation profile of the transparent layer expressing a deformation of the transparent layer during a scanning movement of the lithographic apparatus and a compensator device which is configured to control at least one of the projection system, the substrate table and the support in response to the deformation profile of the transparent layer to compensate for the deformation of the transparent layer during the scanning movement of the apparatus.

In practice, the deformation of the transparent layer differs from target portion to target portion within a substrate making the compensation very difficult as it requires more degrees of freedom in the compensation scheme and/or a lot of calibration. Even when this is feasible, this would increase the induced control noise. Further, when different field sizes of the target portions are used, the compensation scheme needs to be able to cope with every possible field size.

SUMMARY

It is desirable to provide an accurate projection of the pattern onto the substrate.

According to an embodiment of the invention, there is provided a setpoint generator for moving a patterning device of a lithographic apparatus, the patterning device being capable of imparting a radiation beam with a pattern in its cross-section to form a patterned radiation beam, wherein the setpoint generator comprises a finite number of movement profiles for the patterning device, and wherein the setpoint generator is configured to select one of the finite number of movement profiles based on a desired movement profile and to output the selected movement profile as a setpoint for the patterning device.

According to another embodiment of the invention, there is provided a lithographic apparatus comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate;
an actuation system comprising:
an actuator device configured to move the support; and
a control unit comprising a setpoint generator according to the invention and a movement profile determinator, wherein the movement profile determinator is configured to determine the desired movement profile of the patterning device for the target portion and to provide the desired movement profile to the setpoint generator, and wherein the control unit is configured to drive the actuator based on an output from the setpoint generator.

According to yet another embodiment of the invention, there is provided a method of operating a lithographic apparatus according to the invention, wherein the method comprises:
a. moving the patterning device with a transparent layer being coupled to the patterning device in accordance with one of the finite number of movement profiles;
b. moving a substrate;
c. projecting the patterned radiation beam onto a target portion of the substrate;
d. determining a quantity, representative of a deformation profile of the transparent layer during a scanning movement of the lithographic apparatus; and
e. repeating steps a. to d. for each of the finite number of movement profiles.

According to a further embodiment of the invention, there is provided a device manufacturing method wherein use is made of a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
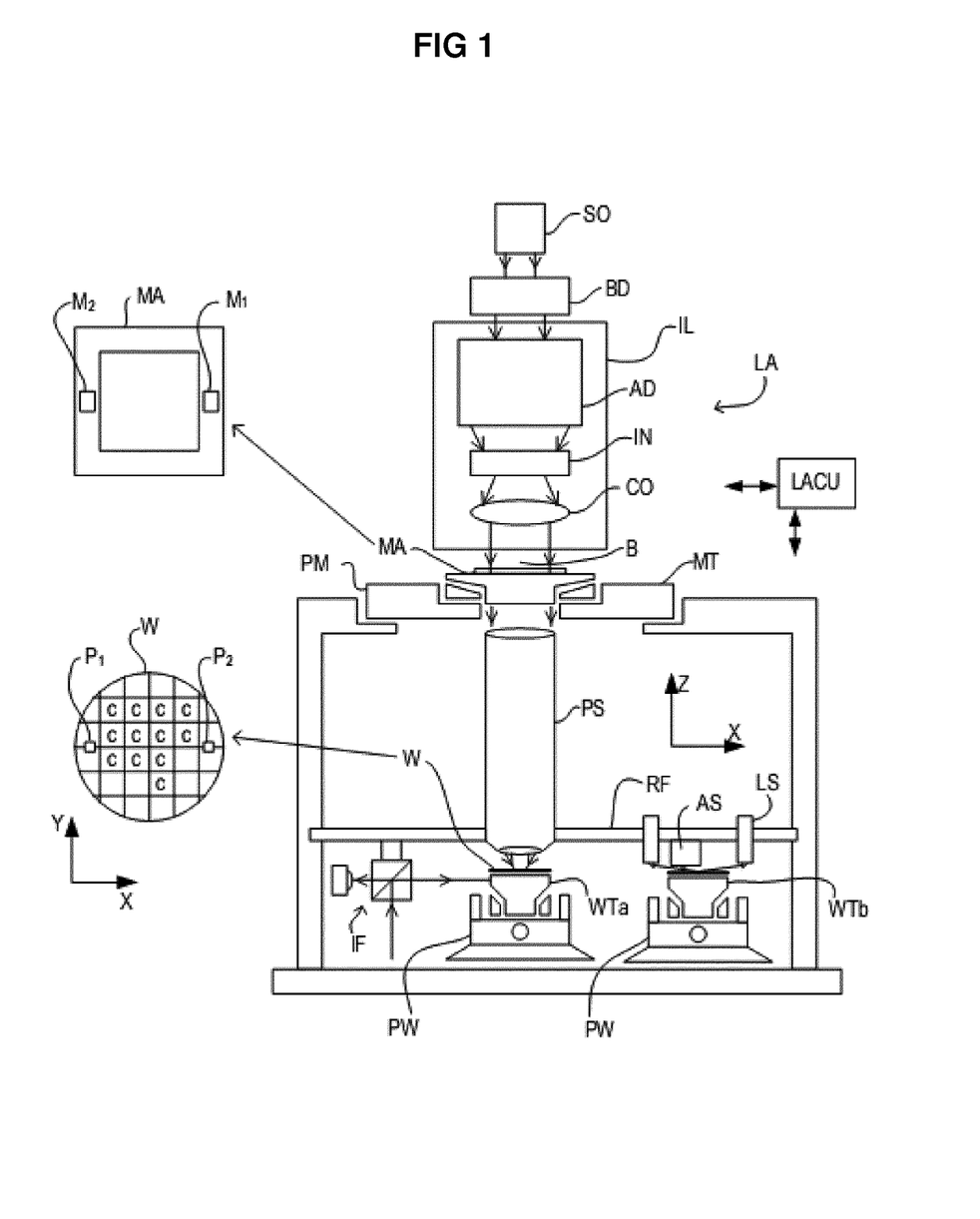
FIG. 1 depicts a lithographic apparatus according to an embodiment of the invention.

FIG. 1 schematically depicts a lithographic apparatus according to one embodiment of the invention. The apparatus comprises:
an illumination system (illuminator) IL configured to condition a radiation beam B (e.g. UV radiation or EUV radiation).
a support structure (e.g. a mask table) MT constructed to support a patterning device (e.g. a mask) MA and connected to a first positioner PM configured to accurately position the patterning device in accordance with certain parameters;
a substrate table (e.g. a wafer table) WTa or WTb constructed to hold a substrate (e.g. a resist-coated wafer) W and connected to a second positioner PW configured to accurately position the substrate in accordance with certain parameters; and
a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate W. It should be noted that the pattern imparted to the radiation beam may not exactly correspond to the desired pattern in the target portion of the substrate W, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "radiation" and "beam" used herein encompass all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of 5-20 nm), as well as particle beams, such as ion beams or electron beams.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illuminator IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam is passed from the radiation source SO to the illuminator IL with the aid of a beam delivery system BD comprising, for example, suitable directing mirrors and/or a beam expander. In other cases the source may be an integral part of the lithographic apparatus, for example when the source is a mercury lamp. The radiation source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks M1, M2 may be located between the dies.

The depicted apparatus can at least be used in scan mode, in which the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de)-magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In addition to the scan mode, the depicted apparatus could be used in at least one of the following modes:

1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
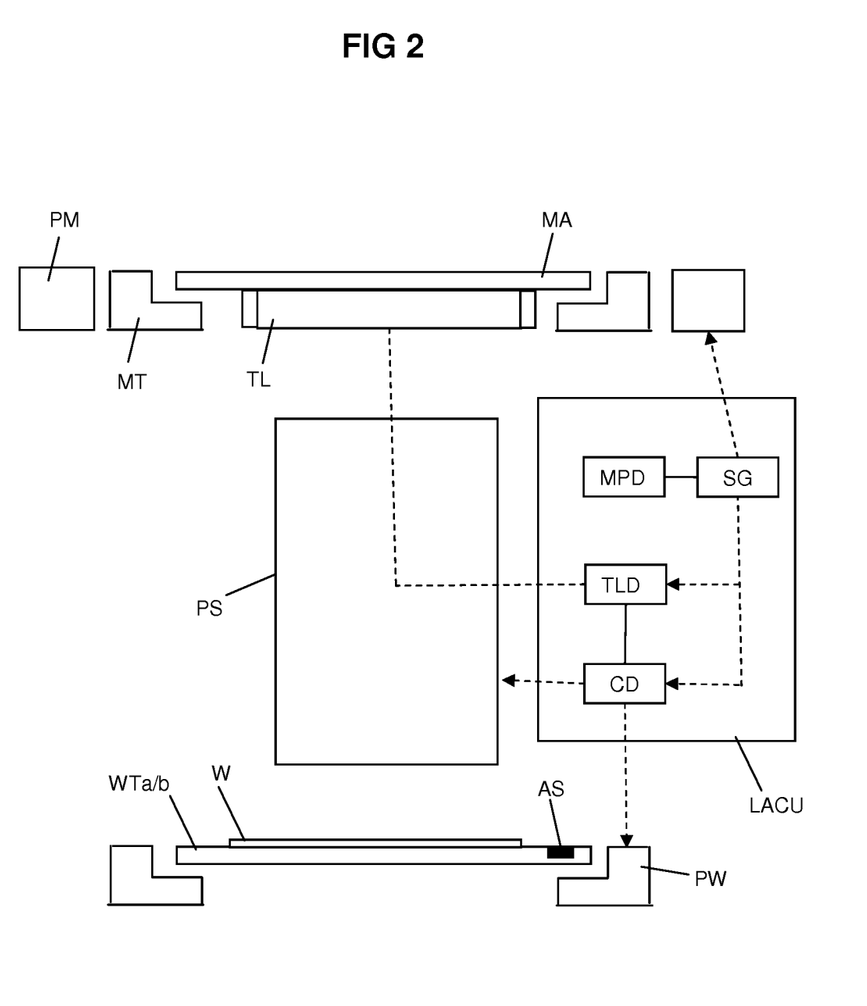
FIG. 2 schematically depicts a part of the lithographic apparatus of FIG. 1.

FIG. 2 schematically depicts a part of the lithographic apparatus of FIG. 1. Shown are the support MT that holds a patterning device MA. The support MT is provided with a transparent layer TL to protect the patterning device MA or the transparent layer is coupled to the patterning device MA in another manner. The transparent layer TL may for example be a pellicle. Also shown are the projection system PS, one of the substrate tables WTa or WTb that holds a substrate W, the substrate positioner PW, the first positioner PM, and the control unit LACU.

The control unit LACU comprises a setpoint generator SG and a movement profile determinator MPD. The movement profile determinator is configured to determine the desired movement profile of the patterning device for the target portion to be exposed. The desired movement profile may be determined based on many variables, parameters and input from other components and control systems of the lithographic apparatus. The desired movement profile aims to project the pattern as accurate and/or quickly on the target portion as possible. The desired movement profile is provided to the setpoint generator SG.

The setpoint generator comprises a finite number of movement profiles for the patterning device, wherein the setpoint generator is configured to select one of the finite number of movement profiles based on the received desired movement profile. The selected movement profile is provided as setpoint to the first positioner PM to move the patterning device in accordance with the selected movement profile.

The control unit LACU further comprises a transparent layer deformation determining device TLD, also referred to as "profiling system" throughout this text, which is configured to determine a deformation profile of the transparent layer, the deformation profile of the transparent layer being indicative of a (dynamically changing) deformation of the transparent layer during a scanning movement of the lithographic apparatus. In an embodiment of the lithographic apparatus according to the invention, a compensator device CD, also referred to as "control system" throughout this text, is configured to control the lithographic apparatus so as to at least partly compensate for the deformation of the transparent layer during the scanning movement of the lithographic apparatus. Thereto, the compensator device CD (or: control system) drives, under control of the deformation profile of the transparent layer, at least one of the projection system PS and the substrate table WT that holds substrate W.

Hence, the transparent layer deformation determining device TLD is able to determine a deformation profile for each of the finite movement profiles of the setpoint generator, so that when the setpoint generator selects one of the finite movement profiles to control movement of the patterning device, the compensator device CD is able to partly compensate for the deformation of the transparent layer during this movement of the patterning device based on the associated deformation profile.

The transparent layer deformation determining device TLD may obtain information about a deformation profile of the transparent layer as occurs during a movement of the lithographic apparatus in operational use of the lithographic apparatus. The transparent layer deformation determining device TLD may obtain information about a deformation profile of the transparent layer, as occurs during a movement of the lithographic apparatus in operational use, from a measurement of the deformation of the transparent layer, or from a mathematical model, or from a measurement of an error resulting from the deformation, or from any combination thereof.

The substrate table WT may include one or more sensors AS that are used to position the substrate W correctly relative to the projection system PS. Typically, such sensors AS typically include a Transmission Image Sensor (TIS). A TIS is a sensor that is used to measure the position at substrate level of a projected aerial image of a mark pattern at the patterning device MA. Typically, the projected image at substrate level is a line pattern with a line width similar to the projection beam wavelength. The TIS measures these mask patterns by using a transmission pattern with a radiation sensor underneath. The sensor data is used to measure the position of the patterning device MA with respect to the position of the substrate table WT in six degrees of freedom. The use of the sensor AS within the context of the invention will be briefly addresses with reference to FIG. 6.

Figure 3A:
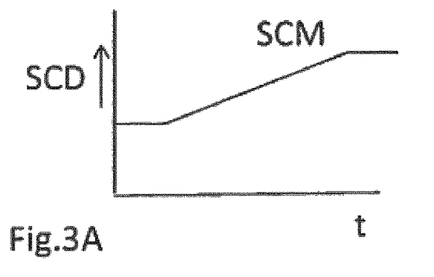
FIGS. 3A and 3B depict a graphical representation of a scanning movement and a deformation profile.
Figure 3B:
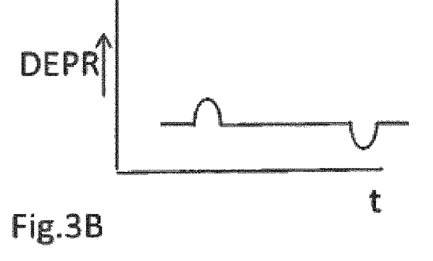

An example of a deformation profile will be described with reference to FIGS. 3A and 3B. FIG. 3A depicts a highly schematic example of a scanning movement SCM of the lithographic apparatus over time t. A position SCD of the support MT, relative to some reference, is depicted along the vertical axis, and time "t" is depicted along the horizontal axis. During a part of the scanning movement, the support MT moves, e.g. at a constant velocity. A deformation profile DEPR of the transparent layer as occurring during the scanning movement of the support MT is schematically depicted in FIG. 3B and set out along the vertical axis, versus time "t" along the horizontal axis. The expression "deformation profile" is to be understood as a deformation of the transparent layer over time during a movement (such as a scanning movement) of the lithographic apparatus. The deformation may be expressed as a function of e.g. time, position or both. The deformation profile may be represented by a single scalar, such as a degree of concaveness or convex-ness. Alternatively, the deformation profile may be expressed in terms of a one-dimensional array or a two-dimensional array of deformation at different locations of the surface of the transparent layer.

Different deformation profiles are provided for different movement profiles of the patterning device. Different movement profiles may be characterized by, e.g., different scan directions (up; down) or different scan profiles (different constant scan speed or different accelerations). Typically, the deformation of the transparent layer depends on the scan direction, and is different for different scan speeds.

A deformation of the transparent layer may affect the path of the patterned radiation beam, and hence the quality of the imaging of the pattern on the substrate covered with a photo-sensitive material, also referred to as "resist". If one knows, to a good approximation, the deformation of the transparent layer in operational use of the lithographic apparatus, one can determine the effect on the path of the patterned radiation beam exiting the transparent layer and the effect on the eventual imaging of the pattern onto the substrate.

At the substrate, an effect of the deformation of the transparent layer is a displacement of the patterned radiation beam from a desired position on the substrate. In order to at least partly compensate for that undesired displacement, the inventors propose to control the position and/or orientation of at least one of: one or more elements of the projection system and the substrate table under control of the deformation. Thus, by determining the effect of a deformation of the transparent layer on the path of the patterned radiation beam and driving at least one of the projection system and substrate table, thereby altering a property of the projection system (e.g. a focus), and/or altering a position of the substrate table, the effect of the deformation of the transparent layer (as is occurring during the scanning movement of the lithographic apparatus) onto the projection of the pattern onto the substrate may at least partly be compensated. The determining may be accomplished in real-time or via a mathematical model determined in advance.

Figure 4:
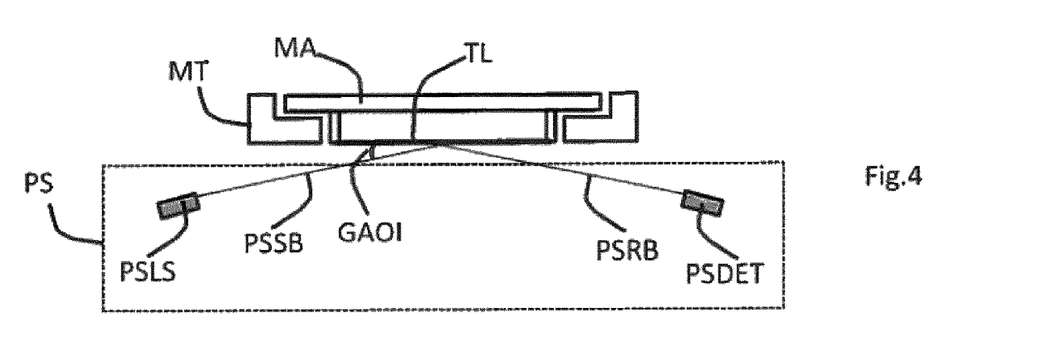
FIG. 4 depicts a sensor to measure a deformation profile.

FIG. 4 depicts a schematic view of a support MT that is provided with a patterning device MA and a transparent layer TL that protects the patterning device MA. A sensor PS senses a position of the transparent layer at a certain location on the transparent layer or another quantity indicative of the position of the transparent later at a certain location. Any suitable sensor PS may be applied. Accordingly, in an embodiment, the transparent layer deformation determining device comprises a sensor PS configured to measure a profile of a position of the transparent layer during the scanning movement of the lithographic apparatus. The position of the transparent layer may be understood as a position of the transparent layer TL relative to the support MT. Thus, as the support MT moves, the sensor PS may sense a position of the transparent layer relative to the support. The position measurement of the transparent layer may enable to detect deformation of the transparent layer during a scanning movement of the lithographic apparatus.

The deformation may occur as a result of one or more causes. For example, a deformation may be caused by gas flows (e.g. of air or nitrogen gas in the lithographic apparatus) in the vicinity of the transparent layer. The gas flows may be induced by relative movements of components within a gas environment. For example, the gas flows may be induced by the movement of the support and/or by movement of the support in respect of other parts of the lithographic apparatus, e.g. a movement of the support relative to the projection system or a movement of the support relative to any other part of the lithographic apparatus. Other gas flows may be present and actively supplied in order to thermally condition, e.g. cool, certain components in the lithographic apparatus, e.g. the patterning device.

Also, the deformation of the transparent layer may be caused by the movement of the support itself, e.g. by a deformation of the transparent layer as a result of the inertia of the transparent layer and an acceleration of the support, during which the edges of the transparent layer tend to follow the acceleration as the edges of the transparent layer are connected (directly or indirectly) to the support, while a center of the transparent layer may deform during such an acceleration due to latency, elasticity, etc. The position of the transparent layer may be measured as an in-plane position, i.e. in the plane of the transparent layer, an out-of-plane position, i.e. a position perpendicular to the plane of the transparent layer when at rest, etc.

In an embodiment, as depicted in FIG. 4, the sensor PS comprises a laser source PSLS configured to radiate a scanning beam PSSB onto the transparent layer TL at a grazing angle of incidence GAOI and a detector PSDET to detect a reflected beam PSRB as reflected from the transparent layer. Due to the grazing angle of incidence, the sensor laser source and the detector may be position outside an optical propagation path of the patterned radiation beam. Moreover, at a grazing angle of incidence, most of the light in the scanning beam will be reflected to the detector PSDET. Furthermore, an interaction of the scanning beam with the patterned radiation beam that is projected onto the substrate may be prevented thereby.

The scanning beam may scan a surface of the transparent layer so as to measure a position of the transparent layer at a variety of locations on the surface of the transparent layer, thereby allowing gaining information about an occurrence of resonances, travelling waves, etc. in the transparent layer.

Still further, e.g. in the case of performing a scanning movement whereby parts of the patterning device are repetitively projected onto the substrate via a so-called slit (not shown), the sensor PS may direct the scanning laser beam at the parts of the transparent layer through which the patterned radiation beam travels at that moment, thus allowing to detect a position of the transparent layer exactly at the locations where the patterned radiation beam is propagating through the transparent layer, thus allowing an accurate position measurement of the relevant portion of the transparent layer. Furthermore, a position measurement by the laser may be fast, thus allowing following movements of the transparent layer so as to be able to take into account thereof.

Other embodiments of the sensor PS may be envisaged. For example, the sensor PS may comprise an air pressure or an array of air pressure sensors that are arranged in, and measure a pressure in, a space between the patterning device and the transparent layer. A deformation of the transparent layer may result in a pressure change in the space between the transparent layer and the patterning device. In case of an array of air pressure sensors, the array for example extending along the transparent layer, a spatial profile of the deformation may be recorded.

Figure 5:
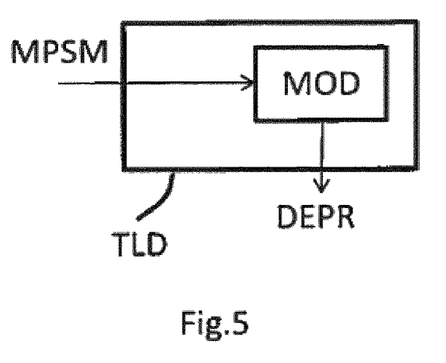
FIG. 5 depicts a highly schematic, block schematic view of a transparent layer deformation determining device.

FIG. 5 depicts a highly schematic view of a transparent layer deformation determining device TLD (also referred to as "profiling system"). In this embodiment, as an alternative to, or in addition to, the sensor PS as described above, the transparent layer deformation determining device comprises a mathematical model MOD of the transparent layer TL and is configured to calculate a deformation profile DEPR of the transparent layer from a movement profile of the scanning movement MPSM of the lithographic apparatus and from the mathematical model.

The mathematical model MOD may be a finite element model (FEM) in order to enable to take account of properties of the transparent layer, such as stiffness, resonance behavior, elasticity, etc. Any suitable mathematical model may be applied, such as a numerical model.

The mathematical model MOD may have been determined in advance outside the lithographic apparatus, or may be determined in advance using the profiling system of the lithographic apparatus, e.g. operated in a calibration mode before operational use of the lithographic apparatus or operated a preceding imaging operation conducted on a preceding substrate of a lot of substrates to be imaged sequentially.

Additionally, mathematical model MOD may be configured to take into account the effect of a gas flow at the transparent layer to calculate or estimate the deformation profile of the transparent layer under the combined influence of the acceleration of the support and the gas flows. An effect of the gas flow on the transparent layer may be large. That is, a spatial distribution of the pressure on the transparent layer as a result of the gas flow may provide a relevant or dominant contribution to the overall deformation of the transparent layer. Modelling of the effect of the gas flow on the deformation may provide a substantial increase in accuracy of the modelling of the deformation of the transparent layer.

Figure 6:
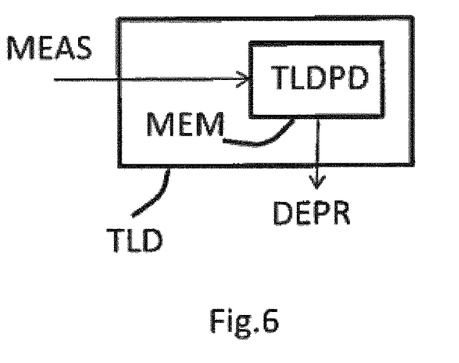
FIG. 6 depicts another highly schematic, block schematic view of a transparent layer deformation determining device.

FIG. 6 depicts a highly schematic view of a transparent layer deformation determining device TLD in accordance with an embodiment of the invention. In this embodiment, the transparent layer deformation determining device TLD comprises a memory MEM in which transparent layer deformation profile data TLDPD is stored, the transparent layer deformation profile data expressing a profile of transparent layer deformation during a scanning movement of the lithographic apparatus and having been measured in advance. Thus a measurement may be performed, whereby the lithographic apparatus performs a scanning movement or other movement that is similar to a movement as to be made in operation, i.e. during imaging. The deformation of the transparent layer or an effect of the deformation of the transparent layer may be measured and measurement results MEAS provided to the transparent layer deformation determining device. For example, a deformation of the transparent layer may be measured using the sensor PS (such as the grazing incidence laser scanner) as described above, during a movement of the lithographic apparatus. Alternatively, an effect of the deformation may be measured, examples of which will be described below.

Correspondingly, a measurement is performed during a test movement, and a profile of a deformation of the transparent layer is derived therefrom. A plurality of such (e.g. different or partly different) movements may be performed and corresponding deformation profiles may be derived therefrom and stored. In operational use of the lithographic apparatus, when a particular movement is being performed, a corresponding stored deformation profile may be applied.

The measurement may be performed in many ways. For example, use may be made of an alignment sensor of the lithographic apparatus (such as the alignment sensor AS as depicted in FIG. 2), which is for example provided on the substrate table WT and which is used to measure an alignment of the lithographic apparatus in that a beam from the irradiation source is directed via the patterning device and the projection system onto the alignment sensor in the substrate table. An example of such an alignment sensor is a transmission image sensor (TIS sensor). Correspondingly, in an embodiment, the lithographic apparatus further comprises an alignment sensor AS and the transparent layer deformation determining device is configured to derive the transparent layer deformation profile data from a measurement by the alignment sensor of an alignment profile during a scanning movement of the lithographic apparatus, and to store the derived transparent layer deformation profile data in the memory. As the radiation beam that reaches the alignment sensor passes through the transparent layer, the image on the alignment sensor provides an indication of a presence of deformation of the transparent layer.

The measurement using the alignment sensor may be performed stationary or during a movement, e.g. a scanning movement of the lithographic apparatus which movement may resemble a movement during operation of the lithographic apparatus to a large extent (the only difference may be that in normal operation the beam is directed onto a target portion of the substrate instead of onto the alignment sensor), causing disturbances onto the transparent layer and resulting deformation thereof to be closely related to disturbances and deformation as may be caused during normal operation. The profile as measured by the alignment sensor may be used to generate the deformation profile which may then be stored in the memory to be used to compensate a future movement that resembles the movement profile of the alignment measurement. A plurality of deformation profiles, as determined for a plurality of movement profiles of the patterning device, may be determined and stored in the memory. During operation of the lithographic apparatus, a stored deformation profile corresponding to the movement profile selected by the setpoint generator SG as will be performed will be chosen.

Figure 7:
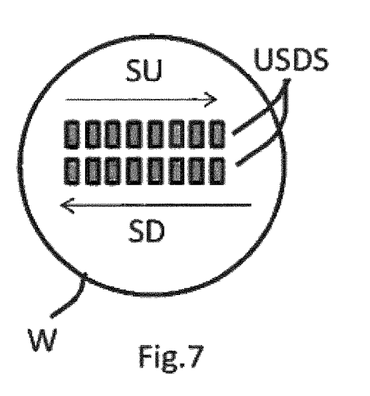
FIG. 7 depicts a sequence of patterns on a substrate as projected during a scanning movement of the lithographic apparatus.

Another possibility for measurement will be explained with reference to FIG. 7. FIG. 7 depicts a substrate W that is provided with a successive up-scan and down-scan projected patterns. The terms "up-scan" and "down-scan" indicate opposite (anti-parallel) scanning directions, also referred to as "scan-up" (SU) and "scan-down" (SD), respectively. More generally, patterns may be provided by irradiating e.g. a sequence of test patterns on a substrate. Information about a deformation of the patterning device may be derived from the projected patterns. Accordingly, in an embodiment, the transparent layer deformation profile data as stored in the memory has been derived from a projection by the lithographic apparatus of a sequence of patterns onto a substrate during a scanning movement of the lithographic apparatus, and a measurement of an error in the projected patterns as obtained during the scanning movement of the lithographic apparatus. Information may be derived from the projected patterns themselves (e.g. a deformation in the pattern) as well as from a comparison of the patterns with each other. For example, referring to FIG. 7, when the scanning movement of the lithographic apparatus comprises an up-scan movement and a down-scan movement, the transparent layer deformation profile data have been derived from a comparison of the projected patterns during the up-scan movement and during the down-scan movement (patterns USDS in FIG. 7). During up-scan and down-scan, disturbances onto the transparent layer (e.g. acceleration profiles, effect of gas flows) may be opposite to each other, enabling to derive a deformation related effects from a comparison of up-scan and down-scan.

Figure 8:
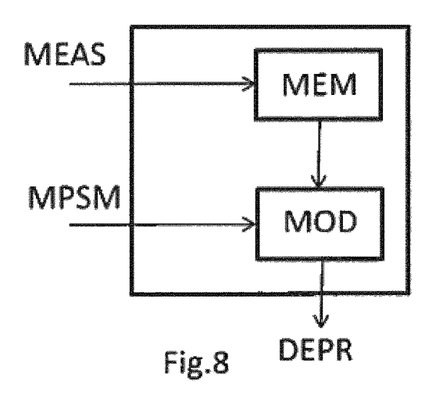
FIG. 8 depicts yet another highly schematic, block schematic view of a transparent layer deformation determining device.

FIG. 8 depicts a highly schematic view of a transparent layer deformation determining device TLD in accordance with another embodiment of the invention. The transparent layer deformation determining device comprises both a memory MEM and a model MOD, as have both been described above. The memory is provided with measurement data MEAS as described previously. The model is provided with a movement profile MPSM as described previously. Making use of both the mathematical model as described above as well as the deformation profile data as stored in the memory, a further improvement in accuracy of estimation may be obtained in that the transparent layer deformation determining device is configured to calibrate the mathematical model from the transparent layer deformation profile data as stored in the memory.

In order to compensate for slow variations in the physical properties of the transparent layer, e.g. elasticity, refractive index, such as caused by aging or temperature effects, e.g. a warming up of the transparent layer as a result of heat generated during operation of the lithographic apparatus, the compensator CD is configured to control at least one of the projection system and the substrate table during a scanning of a following substrate from the deformation profile of the transparent layer as measured during a scanning of a current substrate. Thus deviations as detected and as may result from a deformation of the transparent layer may be processed and taken into account in a later scan. Also, aging of the transparent layer and corresponding change in elastic properties thereof as a result of a repetitive irradiation, may be taken into account thereby. The above may be relevant if the measurement data is determined only once for each patterning device, and the data is re-used every time that that particular patterning device is loaded into the system. Alternatively, the measurement data can be repeated each time the reticle is loaded into the system, possibly at the cost of the system's productivity, depending on how fast the measurement can be executed.

The compensator device may control any suitable parameter in the lithographic apparatus. In particular, in order to effectively compensate at least part of the effects on the patterned radiation beam as a result of the deformation of the transparent layer, the compensator device may be configured to drive the projection system or correct a position of a projection element of the projection system and/or drive the substrate table to correct a position of the substrate table.

Figure 9:
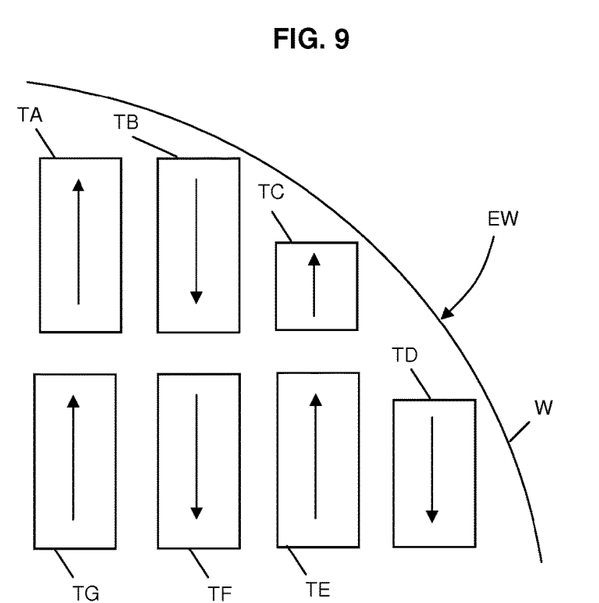
FIG. 9 depicts a portion of a substrate with a number of target portions.

FIG. 9 depicts a portion of a substrate W including target portions TA, TB, TC, TD, TE, TF and TG that are close to an edge EW of the substrate W. When the target portions are exposed, some target portions may be exposed using an up-scan indicated by an arrow in the target portion pointing upwards and other target portions may be exposed using a down-scan indicated by an arrow in the target portion pointing downwards.

Figure 10A:
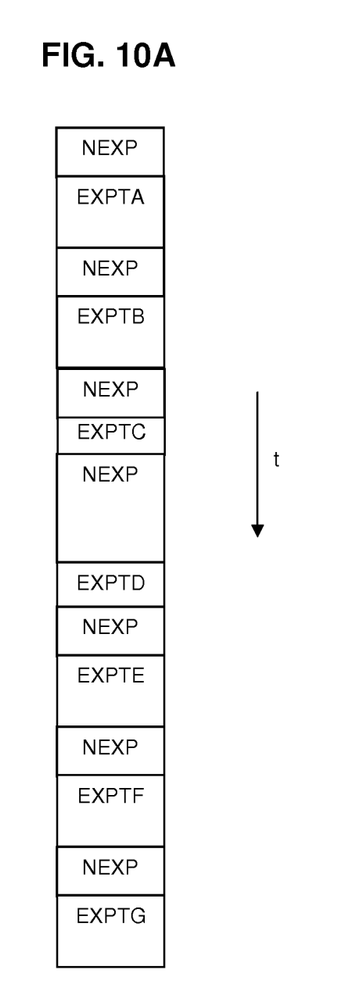
FIG. 10A depicts a prior art sequence of non-exposure operations and exposure operations carried out on the substrate of FIG. 9 by a prior art lithographic apparatus.

FIG. 10A depicts a sequence of non-exposure operations or movements NEXP and exposure operations or movements indicated by reference symbol EXP followed by the target portion that is exposed. FIG. 10A depicts a sequence as carried out by a prior art lithographic apparatus. Time "t" moves forward seen in downwards direction.

Due to the target portions TA, TB, TE, TF and TG being complete target portions, the duration of the corresponding exposures of the target portions TA, TB, TE-TG is similar as indicated by the height of the blocks EXPTA, EXPTB, EXPTE, EXPTF and EXPTG being similar. Target portions TC and TD are smaller and thus the duration of the corresponding exposures of the target portions TC, TD is less than a full field target portion indicated by a lower height of the blocks EXPTC and EXPTD.

During the non-exposure operations NEXP, the patterned radiation beam is virtually moved from one target portion to the next. When moving to the next target portion in a row as is the case between target portions TA and TB, TB and TC, TD and TE, TE and TF, and TF and TG, the duration of the non-exposure is more or less similar as indicated by the similar heights of the corresponding non-exposure blocks NEXP. However, when moving from a target portion in one row to the next target portion in another row as is the case between target portions TC and TD, more time may be required as indicated by an increased height of the corresponding non-exposure block NEXP.

As a result thereof and/or as a result of other processes in the lithographic apparatus, the movements of the patterning device during exposure and non-exposure may not be repeatable across the substrate W.

When using a setpoint generator SG according to the invention in the control unit LACU of a lithographic apparatus as for instance depicted in FIG. 2, the setpoint generator is only capable of selecting a finite number of movement profiles for the patterning device and thus the lithographic apparatus only has to deal with a limited number of deformation profiles and compensation schemes therefor.

As a substrate usually comprises a plurality of target portions, see for example the substrate of FIG. 9, the lithographic apparatus is configured to project the patterned radiation beam onto the plurality of target portions. In such a case, the setpoint generator SG of FIG. 2 may be configured to select a set of movement profiles to be used for the substrate, and to select a movement profile from the set for each of the plurality of target portions. Preferably, the set of movements profiles only comprises one single movement profile. As a result thereof, the deformation profile of the transparent layer is the same for each target portion making the compensation also the same. However, in a more practical embodiment, the set of movement profiles comprises at least two movement profiles, at least one associated with an up-scan and at least one associated with a down-scan.

In an embodiment, the finite number of movement profiles may have different sets that are characterized by one or more of the following parameters: size of the target portion, scan speed, and direction of scan. The finite number of movement profiles may for instance be applicable to ten different target portion sizes, ten different scan speeds and two scan directions (e.g. up and down), resulting in a total number of movement profiles of 200. When a substrate is loaded into the system, the scan speed may be chosen, e.g. by the movement profile determinator, the size of the target portion is inputted, so that the setpoint generator selects the two up and down movement profiles corresponding to the chosen scan speed and target portion size. Each target portion is then exposed using one of the two movement profiles.

Figure 10B:
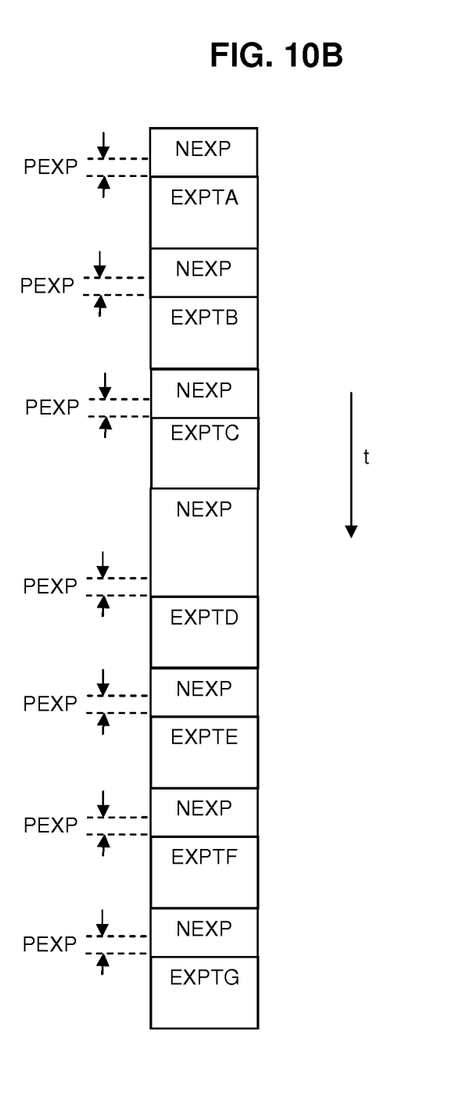
FIG. 10B depicts a sequence of non-exposure operations and exposure operations carried out by on the substrate of FIG. 9 by a lithographic apparatus according to an embodiment of the invention.

A movement profile may comprise an exposure portion and a non-exposure portion. Examples thereof are shown in FIGS. 10A and 10B, wherein the exposure portions are depicted using the reference symbols starting with EXP and the non-exposure portions are depicted using the reference symbols NEXP. During an exposure portion the patterning device is moved during exposing one of the plurality of target portions with the patterned radiation beam. The non-exposure portions NEXP each comprise a pre-exposure portion PEXP which is directly followed by the exposure portion.

FIG. 10B depicts a similar sequence of exposure portions EXP and non-exposure portions NEXP as FIG. 10A to expose the target portions of FIG. 9. However, the sequence of FIG. 10B is the result of the setpoint generator SG according to the invention. The set of at least one movement profiles selected by the setpoint generator comprises movement profiles of which the duration of the exposure portions of the movement profiles in the set are identical. This means that the target portions TC and TD, although not being full size target portions, are scanned using a movement profile corresponding to a full size target portion. Exposure portions EXPTC and EXPTD are thus extended compared to the situation in FIG. 10A and comprise a first portion in which the target portion is actually exposed to the patterned radiation beam and a second portion in which the movement of the patterning device is as if exposure is still ongoing, but the patterned radiation beam is not projected onto the substrate.

In an embodiment, the setpoint generator selects the set of movement profiles such that the set comprises at least two movement profiles, wherein the exposure portions of the movement profiles in the set are identical with respect to a moving speed of the patterning device.

In a further embodiment, the set of movement profiles comprises at least two movement profiles, wherein the pre-exposure portions are identical. The movements in the pre-exposure portions may have an effect on the deformation of the transparent layer during the exposure portion. Hence, when the movement profiles are identical in the pre-exposure portion as well, the deformation in the exposure portion is more predictable and thus easier to compensate. The length of the pre-exposure portion depends on the type of transparent layer and how quickly movements of the transparent layer are damped.

When selecting the set of movement profiles, the target portion size associated with the selected movement profiles is larger than the actual target portion size on the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A setpoint generator for moving a patterning device of a lithographic apparatus, a transparent layer being coupled to the patterning device, the patterning device being capable of imparting a radiation beam with a pattern in its cross-section to form a patterned radiation beam, wherein the setpoint generator comprises:
    a finite number of movement profiles for the patterning device, and
    wherein the setpoint generator is configured to select one of the finite number of movement profiles based on at least a desired movement profile and a type of the transparent layer and to output the selected movement profile as a setpoint for the patterning device.

2. The setpoint generator of claim 1, wherein:
    the lithographic apparatus is arranged to project the patterned radiation beam onto a plurality of target portions on a substrate,
    the setpoint generator is configured to select a set of at least one movement, and
    the setpoint generator is configured to select a movement profile from the set for each of the plurality of target portions.

3. The setpoint generator of claim 2, wherein:
    the finite number of movement profiles each comprise an exposed portion for moving the patterning device during exposing one of the plurality of target portions with the patterned radiation beam,
    the set of at least one movement profiles comprises at least two movement profiles, and
    the exposure portions of the movement profiles in the set are identical with respect to a moving speed of the patterning device.

4. The setpoint generator of claim 2, wherein:
    the set of at least one movement profiles comprises at least two movement profiles, and
    a duration of the exposed profiles of the movement profiles in the set are identical.

5. The setpoint generator of claim 2, wherein:
    the set of at least one movement profiles comprises at least two movement profiles,
    the set of movement profiles each comprise a pre-exposure portion directly followed by the exposure portion, and
    the pre-exposure portion of the movement profiles in the set are identical.

6. The setpoint generator of claim 1, wherein:
    the desired movement profile has a desired movement duration,
    the selected movement profile has a movement duration, and
    the movement duration is larger than the desired movement duration.

7. A lithographic apparatus comprising:
a support constructed to support a patterning device, a transparent layer coupled to the patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate;
an actuation system comprising:
an actuator device configured to move the support; and
a control unit comprising a setpoint generator comprising:
a finite number of movement profiles for the patterning device, and
wherein the setpoint generator is configured to select one of the finite number of movement profiles based on at least a desired movement profile and a type of the transparent layer and to output the selected movement profile as a setpoint for the patterning device, and
a movement profile determinator, wherein the movement profile determinator is configured to determine the desired movement profile of the patterning device for the target portion and to provide the desired movement profile to the setpoint generator, and wherein the control unit is configured to drive the actuator based on an output from the setpoint generator.

8. The lithographic apparatus of claim 7, further comprising a profiling system configured to determine a quantity representative of a deformation profile of the transparent layer coupled to the patterning device during movement of the patterning device.

9. The lithographic apparatus of claim 7, wherein:
the finite number of movement profiles each comprise an exposure portion for moving the patterning device during exposure of the target portion with the patterned radiation beam and a pre-exposure portion directly followed by the exposure portion, and
a duration of the pre-exposure portion is based on the type of transparent layer coupled to the patterning device.

10. The lithographic apparatus of claim 7, wherein, when the target portion is only partially on the substrate, the setpoint generator is configured to select one of the finite number of movement profiles corresponding to a complete target portion.

11. The lithographic apparatus of claim 7, wherein the desired movement profile corresponds to a desired target portion size, wherein the selected movement profile corresponds to a target portion size, wherein the target portion size is larger than the desired target portion size.

12. A device manufacturing method wherein use is made of a lithographic apparatus of claim 7.

13. A method of operating a lithographic apparatus comprising:
moving a patterning device with a transparent layer being coupled to the patterning device in accordance with one of a finite number of movement profile, the one of the finite number of movement profile being selected at least based on a type of the transparent layer;
moving a substrate;
projecting patterned radiation beam onto a target portion of the substrate;
determining a quantity, representative of a deformation profile of the transparent layer during a scanning movement of the lithographic apparatus; and
repeating moving, projecting, and determining for each of the finite number of movement profiles.

14. The method of claim 13, further comprising controlling at least one of the moving of the substrate and the projecting under control of the quantity associated with the movement profile used to move the patterning device.

15. A lithographic apparatus comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate;
an actuation system comprising:
an actuator device configured to move the support;
a transparent layer coupled to the patterning device; and
a control unit comprising a setpoint generator comprising:
a finite number of movement profiles for the patterning device, the finite number of movement profiles each comprising an exposure portion for moving the patterning device during exposure of the target portion with the patterned radiation beam and a pre-exposure portion directly followed by the exposure portion, a duration of the pre-exposure portion being based on a type of transparent layer coupled to the patterning device, and
wherein the setpoint generator is configured to select one of the finite number of movement profiles based on a desired movement profile and to output the selected movement profile as a setpoint for the patterning device, and
a movement profile determinator, wherein the movement profile determinator is configured to determine the desired movement profile of the patterning device for the target portion and to provide the desired movement profile to the setpoint generator, and wherein the control unit is configured to drive the actuator based on an output from the setpoint generator.

* * * * *

UNITED STATES PATENT AND TRADEMARK OFFICE
CERTIFICATE OF CORRECTION

Page 1 of 1

PATENT NO. : 10,908,517 B2
APPLICATION NO. : 16/615810
DATED : February 2, 2021
INVENTOR(S) : Van Damme et al.

It is certified that error appears in the above-identified patent and that said Letters Patent is hereby corrected as shown below:

In the Claims

In Column 16, Line 39, replace "the finite number of movement profiles each comprise" with --the finite number of movement profiles each comprises--.

In Column 16, Lines 40-41, replace "during exposing one of the plurality of target portions" with --during exposing of one of the plurality of target portions--.

In Column 17, Line 36, replace "the finite number of movement profiles each comprise" with --the finite number of movement profiles each comprises--.

Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*